United States Patent [19]
Marantz et al.

[11] Patent Number: 6,061,511
[45] Date of Patent: May 9, 2000

[54] RECONSTRUCTION ENGINE FOR A HARDWARE CIRCUIT EMULATOR

[75] Inventors: Joshua D. Marantz, Cambridge; Charley Selvidge, Wellesley; Ken Crouch, Cambridge; Mark E. Seneski, Roslindale; Muralidhar R. Kudlugi, Framingham; William K. Stewart, Lexington, all of Mass.

[73] Assignee: Ikos Systems, Inc., Cupertino, Calif.

[21] Appl. No.: 09/097,138

[22] Filed: Jun. 12, 1998

[51] Int. Cl.$^7$ ...................................................... G06F 9/455
[52] U.S. Cl. ................................. 395/500.49; 395/500.44; 714/47
[58] Field of Search ............................... 395/500, 500.45, 395/500.46, 500.47, 500.48, 500.49; 714/47

[56] References Cited

U.S. PATENT DOCUMENTS

| | | | |
|---|---|---|---|
| 5,680,583 | 10/1997 | Kuijsten | 395/500.44 |
| 5,754,827 | 5/1998 | Barbier et al. | 395/500.35 |
| 5,790,832 | 8/1998 | Barbier et al. | 395/500 |
| 5,854,752 | 12/1998 | Agarwal | 395/500.08 |
| 5,884,066 | 3/1999 | Kuijsten | 395/500.49 |

OTHER PUBLICATIONS

M.A. d'Abreu, "Gate Level Simulation", IEEE Design and Test, pp. 63–71, Dec. 1985, pp. 63–71.
Cadence Design Systems Inc.. Verilog–XL Reference Manual, Version 2.3, "Value Change Dump File", Dec. 1995, pp. 20–1 through 20–24.
Design Acceleration Inc., Signalscan Database, http://www.designacc.com/Products/sst2db/ss2db.html, 1998, 5 pages.
Ikos Systems Inc., VirtualLogic Data Sheet, http://www.ikos.com/products/vsli/index.html, May, 1997, 4 pages.
Ikos Systems Inc., VirtualLogic SLI ASIC Emulation product specification, 1998, 2 pages.
D. Kirovski, M. Potkonjak, "A Quantitiative Approach to Functional Debugging", ICCAD 1997, pp. 170–173.
P.C. McGeer, et al., "Fast Discrete Function Evaluation Using Decision Diagrams", ICCAD 1995, pp. 402–407.
Quickturn Design Systems, Colbalt Data Sheet, http://www.quickturn.com/products/cobalt.htm, 1999, 8 pages.
Quickturn System Realizer Data Sheet, http://www.quickturn.com/products/systmrealizer.htm, 1999, 6 pages.
A.L. Sangiovanni–Vincentelli et al., "Verification of Electronic Systems", 33rd DAC, pp. 106–111, 1996.
Speedsim Inc., Cycle Simulation Technology, http://www.speedsim.com/technology/cbs.htm, 1999, 5 pages.
Summit Design Inc., Virsim Data Sheet, http://www.sd.com/products/verification/virsim.html, 1998, 7 pages.
Veritools, Undertow Data Sheet, http://www.veritools-web.com/towv.htm, 5 pages.
XILINX, Inc., "The XC4000 Data Book", Aug. 1992, pp. 2–16.
Marantz, "Enhanced Visibility and Performance in Functional Verification by Reconstruction", 1998 IEEE Proceedings of the Design Automation Conference, pp. 164–169, Jun. 1998.
Quickturn Design Systems, Inc., "System Realizer", http://www.quickturn.com/products/systemrealizer.htm, 1998.
"Quickturn Enhances Software", Computer Design, http://www.computer–design.com/Editorial/1996/06/Briefs/quickturn.html., 1996.

*Primary Examiner*—Kevin J. Teska
*Assistant Examiner*—Samuel Broda
*Attorney, Agent, or Firm*—Skjerven, Morrill, MacPherson, Franklin & Friel LLP; Edward C. Kwok

[57] ABSTRACT

A system and a method provide full visibility to each net of a design under modeling by saving states of the design during modeling and reconstructing waveforms at each net by logic evaluation using the saved states. In one embodiment, primary data input signals and memory output signals ("sample signals") are saved by a logic analyzer, and used in an emulator to generate state vectors from a state snapshot previously recorded. Data compression techniques can be applied to minimize storage requirements, and parallel evaluation of segments of waveforms can be achieved, since saved states for the entire period of interest are available for waveform reconstruction at the time of the logic evaluation.

41 Claims, 11 Drawing Sheets

RECONSTRUCTION ENGINE FOR A HARDWARE CIRCUIT EMULATOR

BACKGROUND OF THE INVENTION

1. Field of the Invention

The present invention relates to hardware circuit emulation. In particular, the present invention relates to providing a logic signal transition trace ("waveform") for any internal net in a device under emulation.

2. Discussion of the Related Art

In hardware emulation, a logic design is compiled for implementation in a "bread board" of field programmable logic elements (e.g., field programmable gate arrays or FPGAs). FIG. 1 is a simplified block diagram illustrating a hardware circuit emulator 100. As shown in FIG. 1, circuit emulator 100, which is typically under control of a host computer or "workstation" 101 (not shown), includes (a) a user logic design portion 102 for implementing the device under emulation, and (b) a probe portion 103 for receiving and routing selected internal signals of user logic design portion 101 to a logic analyzer interface 104. Typically, user logic design portion 102 and probe portion 103 are implemented by configuring the bread board of FPGAs, with each FPGA in user logic design portion 102 providing a small number of signals (e.g., two signals per FPGA) over a "probe bus" 106 to a probe FPGA in probe portion 103. The primary input and output signals of user design portion 102 and the probe output signals of probe portion 103 are provided to logic analyzer interface 104 for access by a logic analyzer 105.

For a large design (e.g., a million gates), the number of internal nodes or nets that can be monitored during emulation through the mechanism of FIG. 1 is limited by (i) the number of signals that can be routed between user design portion 102 to probe portion 103, (ii) the available number of signals in logic analyzer interface 104, and (iii) the amount of memory in logic analyzer 105. The number of signals that can be routed between user design portion 102 and probe portion 103, and in logic analyzer interface 104 can be increased using the "virtual wire" technique. An example of the virtual wire technique is disclosed in a copending patent application, entitled "Circuit Partitioning Technique for use with Multiplexed Interconnection" by Anant Agarwal et al., Ser. No. 08/588,649, filed Jan. 19, 1996 now U.S. Pat. No. 5,854,752 issued on Dec. 29, 1998 and assigned to IKOS Systems, Cupertino, Calif., which is also the Assignee of the present application. The disclosure of 08/588,649 Application is hereby incorporated by reference in its entirety. However, to increase the amount of memory in a logic analyzer is costly, since very fast memory components are used in a logic analyzer.

Under the virtual wire technique, time in emulator 100 is discretized to a "virtual clock" (vclk) signal, which is typically many times the frequency of the clock signals of the design under emulation. The vclk signal allows multiple signals routed between FPGAs to time-share an input/output pin. Multiplexing of signals is accomplished by synthesizing additional logic circuits in each FPGA. Using this technique, for example, if 10 signals share each single input/output pin, and if logic analyzer interface 104 includes 192 wires, then over 1900 signals from user design portion 102 can be routed through probe portion 103 to logic analyzer 105. However, for a large design, the number of signals that can be routed to logic analyzer 105 represents a very small percentage of the total number of nets.

Since the number of nets that can be examined by logic analyzer 105 represents a very small percentage of all nets in a large design, the designer must specifically select, prior to the emulation, which of the nets are to be examined by logic analyzer 105. Any net not selected cannot be reexamined without resynthesizing the emulator model of the design. The typical process flow is illustrated by flow diagram 200 of FIG. 2. As shown in FIG. 2, a design netlist (indicated by reference numeral 202) is downloaded into a modeling engine 205. (A modeling engine can be an emulator or a simulator). At the same time, the user (indicated by reference numeral 201) specifies a list of desired signals to be examined by modeling engine 205 (e.g., input signals, state variables in the design netlist, and selected internal signals) before modeling can begin in modeling engine 205. As the modeling process progresses, a logic trace (indicated by reference numeral 203) is provided for each signal in the list of desired signals. A conventional waveform tool 204 can then access the saved logic trace to retrieve the waveform of the desired signals. Under this approach, to retrieve the waveform of any signal not included in the initial list of desired signals, process 200 must be re-run. Further, while re-running process 200 is cumbersome and time-consuming in a simulation environment, re-running process 200 in an emulator may be impossible since some "real-world" input stimuli may not be readily reproducible.

SUMMARY OF THE INVENTION

The present invention provides visibility into every net of a design under a modeling process (e.g., emulation or logic simulation). According to one method of the present invention, total visibility can be achieved by:

First, (a) running an emulation for the design and, during the modeling process, (b) providing at predetermined intervals from the emulation snapshots of the emulation, and (c) providing a set of sample signals at each clock signal transition in the design. (Each design can have multiple clock domains. In this instance, a snapshot includes values of output signals of state elements of the design and sample signals include primary input signals of the design, output signals of memory circuits in the design, and at least one signal from each combinational feedback cycle).

Then, at a subsequent time, when waveforms of a specific time period are requested, the emulation is rerun for that time period by loading into the state elements a snapshot of the state elements of the design for that time period and, at each clock signal transition subsequent to the snapshot, (a) applying the sample signals at each clock signal transition of the design, and (b) providing as output a state vector resulting from that clock signal transition. (In this instance, a state vector includes values of the state elements at the clock signal transition).

Finally, the state vectors and the sample signals are used to evaluate the waveforms of any net, using a waveform tool. The waveform tool couples to a reconstruction engine, which evaluates the logic value at the designated nets of the design. The waveform tool takes the state vectors and the sample signals as input stimuli.

In one embodiment, the snapshots are taken at predetermined intervals computed from the number of clock signal transitions in the multiple clock domains of a design, and the sample signals include output signals of state elements. The snapshots can be saved in first-in-first-out (FIFO) memories configured with the state elements. The sample signals can be recorded by a logic analyzer receiving these signals over a probe interface from the emulator.

The emulation can be run under a virtual clock signal environment. In that case, the number of virtual clock cycles between successive sets of the sample signals is recorded. During the re-running step, the sample signals are applied to the design in such a manner as to preserve the number of elapsed virtual clock cycles between application of successive sample signals as in the first emulation. Using this approach, many "asynchronous" events, including race conditions can be faithfully reproduced, and hence visible through the waveforms generated from the resulting state vectors.

In another embodiment, the state vectors are stored using a data compression technique, such as run-length encoding.

In one embodiment, the emulator replaces each latch in the design by a flip-flop. This technique allows emulation time to be optimized in some instances by skipping over intermediate signal transitions that are invisible to circuits downstream to the replaced latches. (e.g., if an output signal of the latch is not sampled until after a predetermined clock signal transition, intermediate transitions of the output signal before the sampling clock signal transition can be ignored.) In that embodiment, to restore timing of the intermediate transitions to appear in the simulated waveform, a method of the present invention undoes the optimization when the state vectors are retrieved from the second emulation. In this manner, all transitions in the waveforms to be viewed can be faithfully reconstructed by the logic simulator, and made visible in a waveform tool.

Because the state vectors and sample signals are provided throughout the time period of interest, multiple segments of waveforms can be evaluated by the reconstruction engine in parallel. The temporal dependencies usually associated with functional modeling are thereby eliminated.

In one embodiment, the design under emulation is compiled with a scan chain to download sample signals from the controlling host workstation into the design under emulation during the re-run. Further, during the re-run, the state vectors can be scanned out of the design under emulation using the same scan chain.

According to another aspect of the present invention, the reconstruction engine uses a circuit model generated from the user design. The circuit model can be a source model compilable into executable object code. In one implementation, the circuit model is generated on demand ("on-demand model"), i.e., after the user selected the waveforms he/she wishes to view. The on-demand model allows the model compiler to only elaborate the portion of the design hierarchy encompassing the nets of interest. In an on-demand model, only the necessary nets are evaluated, thus achieving efficiency in the waveform evaluation process. Alternatively, according to one implementation, the circuit model ("precompiled model") includes both a netlist of the design and a kernel of utility routines. A precompiled model form a module callable from the reconstruction engine to perform the evaluation step.

According to the present invention, a system for reconstructing waveforms of nets of a design under emulation includes (a) a model compiler for compiling a design into a logic circuit configurable in an emulator; (b) an emulation controller receiving from the model compiler the compiled logic circuits, and configuring the compiled logic circuits in an emulation, (c) a reconstruction engine interface for access to a logic evaluation tool, and (d) a waveform tool for accessing results from the logic evaluation tool. In one embodiment of such a system, the model compiler provides a memory circuit for saving values of selected state elements and a loading circuit for loading values into the state elements. In addition, the emulation controller causes (a) a first emulation of the compiled logic circuits, (b) snapshots of the selected state elements to be saved into the memory circuit (e.g., a FIFO memory) at predetermined intervals, and (c) at a later time, a second emulation of the compiled logic circuits, starting from one of said snapshots of the selected state elements, and providing as output state vectors at selected times as the second emulation progresses. Further, the interface to the waveform tool provides as a circuit model a representation of the design and the state vectors for use in a reconstruction engine. Such a reconstruction engine provides the waveforms of the selected nets on demand.

According to another aspect of the present invention, the system can further include a logic analyzer coupled to the emulator. The model compiler can provide a probe circuit in the compiled logic circuits to allow routing of primary input signals to the logic analyzer. In addition, the probe circuit can also provide the logic analyzer output signals of memory elements, and one signal from each combinational cycle in the compiled logic circuits. The primary input signals, the memory output signals and the signals from combinational cycles, generally referred collectively as the "sample signals," are used in the second emulation to create the state vectors.

In a precompiled model, the reconstruction engine is provided an executable model of the design, together with utility routines for data management and for application of the state vectors to the executable model. To facilitate creation of the executable model, a second model compiler (which can be implemented integrally with the first model compiler) generates the reconstruction model using a partial circuit elaborator. By elaborating only the portion of the circuit including the nets of interest, high reconstruction efficiency is obtained by avoiding evaluation of nets not necessary to provide the waveforms of the nets of interest.

The state vectors can be retrieved from the design under emulation using a scan chain that can be configured with the compiled logic circuit. Similarly, sample signals can be applied to the design under emulation using the same scan chain.

In accordance with another aspect of the present invention, a method is provided to reconstruct a waveforms of an internal terminal of a circuit over given time period. The method includes the steps of: (a) receiving logic values of state elements of the circuit at successive clock transitions of the clock domains over the time period; (b) receiving input values to the circuit at the successive clock transitions of the clock domains; and (c) evaluating the waveform using a model of the circuit, the logic values of the state elements, and the sample signals. The method can evaluate selected time points of the waveform in parallel.

The present invention is better understood upon consideration of the detailed description below and the accompanying drawings.

DETAILED DESCRIPTION OF THE PREFERRED EMBODIMENTS

The present invention provides the user visibility into every signal of a design under a modeling process (e.g., emulation or logic simulation), by taking snapshots of state elements in the design, and capturing input stimuli to the design during the modeling process. The snapshots and the input stimuli are used to reconstruct, on demand, a logic trace for any signal in the design. The state elements, though numerous, typically represents only less than 10 percent of all nets in a design. Thus, by the reconstruction process of the present invention, 100% visibility into all nets can be accomplished storing only less than 10 percent of all signal transitions. In the following description, although the present invention is illustrated using, as example, an emulator, the present invention is applicable to all modeling processes, such as emulation and logic simulation.

Figure 2:
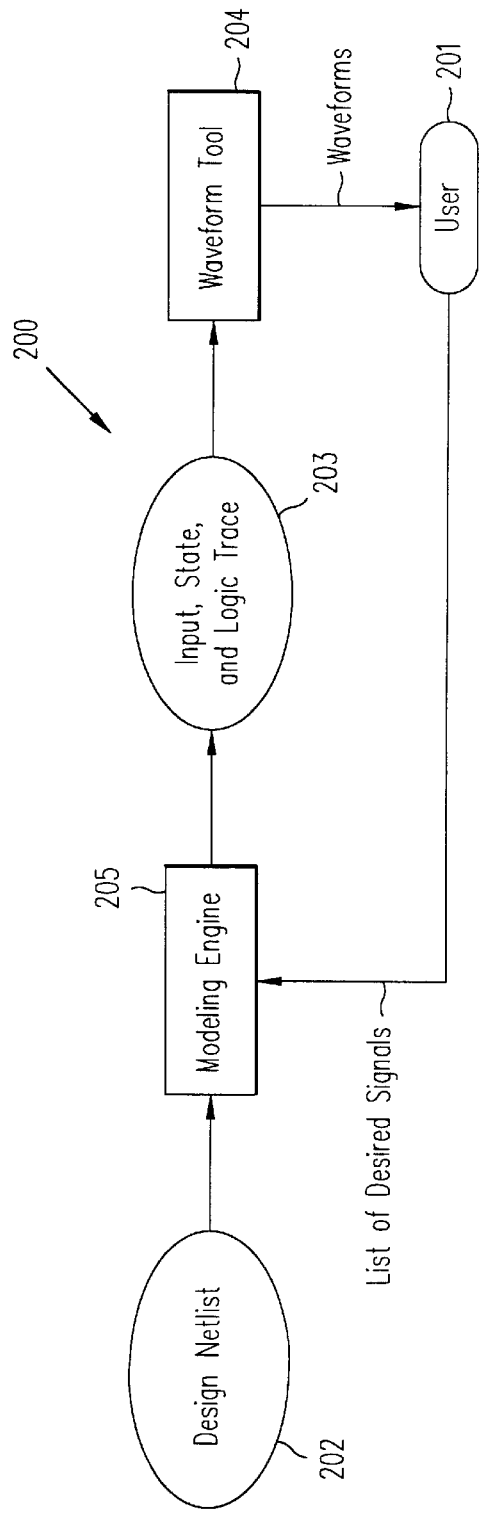
FIG. 2 illustrates a conventional process flow 200 for retrieving logic traces of designated nets.
Figure 3:
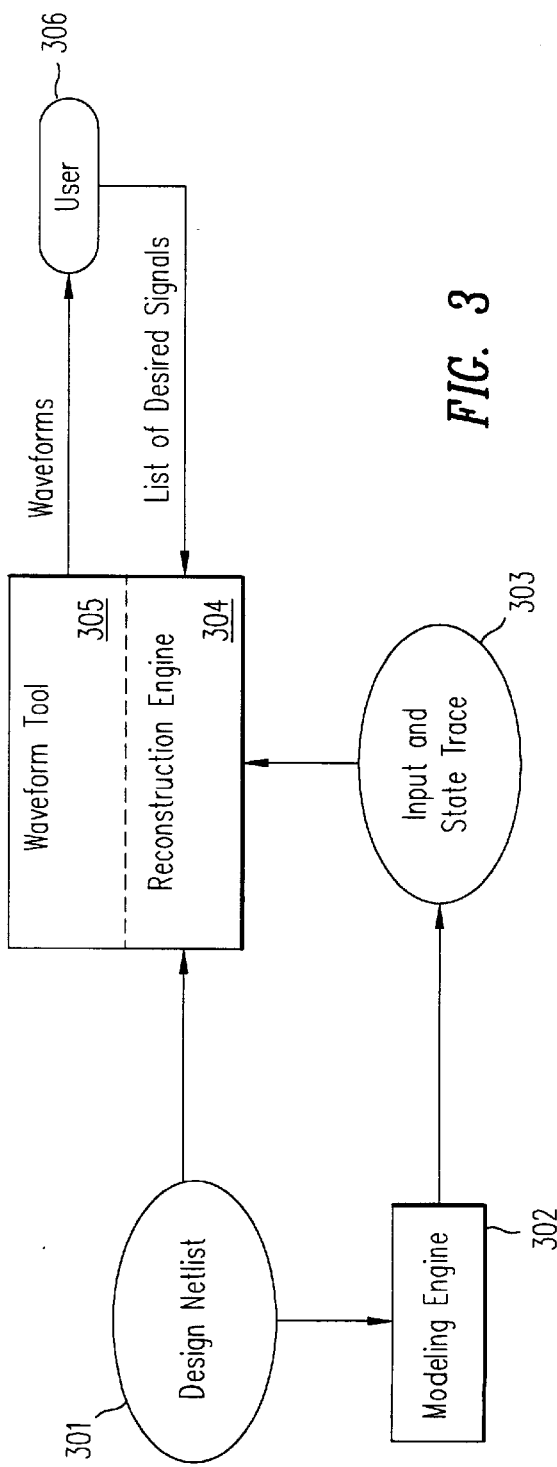
FIG. 3 illustrates a process flow 300 under the present invention for retrieving a waveform for any signal in a design.

FIG. 3 illustrates a process flow 300 under the present invention for retrieving a waveform for any signal in a design. As shown in FIG. 3, design netlist 301 is downloaded into a modeling engine 302 for modeling (e.g., simulation or emulation). Modeling engine 302 provides to a "reconstruction engine" 304 (a) a logic trace for each of the input stimuli at design's input terminals, and (b) a logic trace of each of the state values of the state elements in the design. The logic traces are represented by reference numerals 303. Associated with reconstruction engine 304 is a waveform tool 305 and a user interface 306. Waveform tool 305 can be implemented by a conventional waveform tool, such as waveform tool 204 of FIG. 2. Under the present invention, the user can request, through user interface 306, reconstruction of a logic waveform of any signal in the design. Based on design netlist 301 and the state and input logic traces 303 provided by modeling engine 302, reconstruction engine 302 creates the desired waveforms and provide them to the user over user interface 306.

Figure 1:
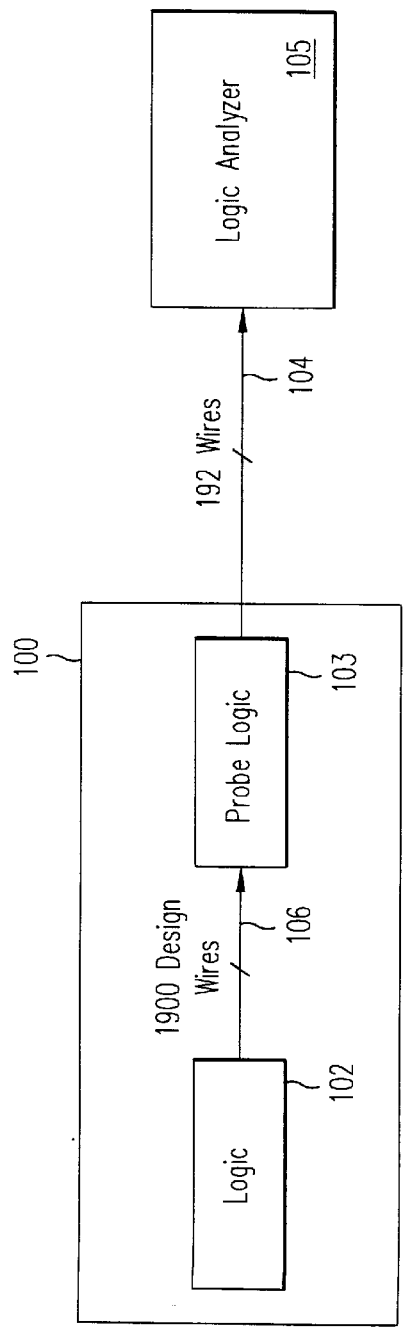
FIG. 1 is a simplified block diagram of an emulator 100 coupled to a logic analyzer 105 over logic analyzer bus 104.
Figure 4:
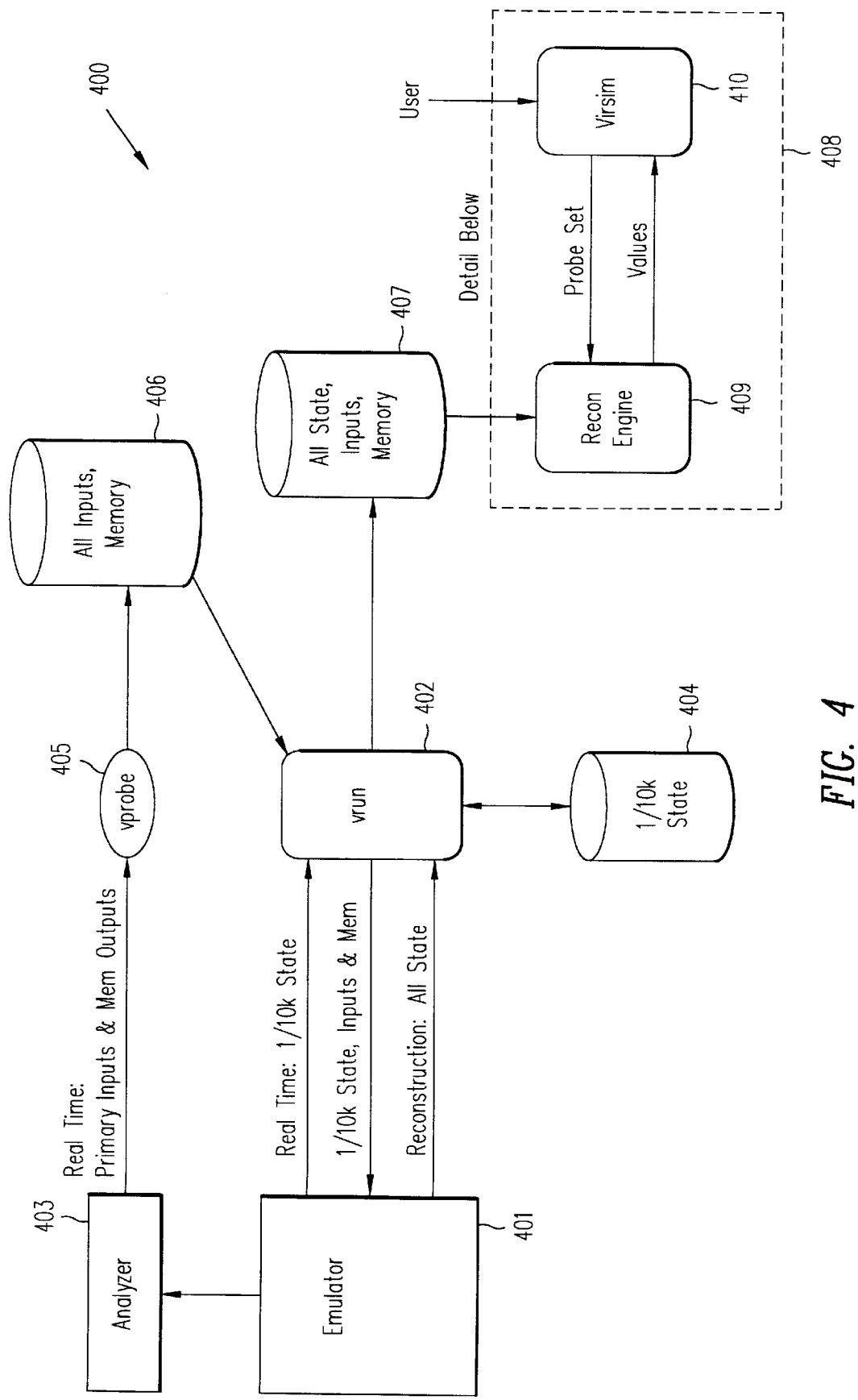
FIG. 4 is a block diagram showing emulation system 400, which is one embodiment of the present invention.

FIG. 4 is a block diagram of an emulation system 400, which is one embodiment of the present invention. In system 400, an emulator 401 reports periodically (e.g., once every 10,000 clock periods) a snapshot of state elements of a design under emulation to a control program ("vrun") 402. The reported snapshots are stored in a storage device indicated by reference numeral 404 for retrieval in a subsequent reconstruction step. Control program 402, typically running on an engineering workstation interfaced to emulator 401, controls the emulation in emulator 401. A logic analyzer 403 monitors selected signals in the design under emulation using the mechanism described above with respect to FIG. 1. In addition, logic analyzer saves the values of the primary input signals, memory output signals, and one signal from each combinational cycle ("sample signals"), under control of a control program "vprobe" 405, into a storage device indicated by reference numeral 406. For a large design, treating a large read/write memory as a collection of state elements is both unnecessary and impractical. Thus, the present invention treats the output signals of a read/write memory the same way as it treats primary input signals to the design under emulation. Thus, memory output signals are probed to logic analyzer 403 at every clock period. The output signals of a read-only memory are also sampled, although such output signals can sometimes be treated as combinational logic.

During reconstruction, a user requests the waveforms of selected internal signals of the design. In response, reconstruction subsystem 408, described in further detail below, requests control program 402 to search for the earliest snapshot stored. Control program 402 retrieves the selected snapshot from storage 404. Then, the selected snapshot is downloaded into emulator 401, and the emulation is re-run or replayed from the snapshot. During this replay, the emulation is advanced clock period by clock period, under control of control program 402, using the input signals and memory output signals stored in storage device 406. The values of the state elements (a "state vector") at every clock signal transition in the design under emulation are provided to control program 402. The state vectors are then stored in a storage device 407, to be accessed by reconstruction subsystem 408 at a later time. In this embodiment, reconstruction subsystem 408 includes a reconstruction engine 409 and a waveform display tool 410, which interactions are described in further detail below. Based on this complete state information, reconstruction engine 409 and waveform display tool 410 can provide the user any logic waveform of any net in the design under emulation.

In one implementation of emulation system 400, the primary input signals, the memory output signals, and the signals from combinational cycles are stored in the memory of logic analyzer 403. In that implementation, a user sets a trigger condition in logic analyzer 403. Upon the trigger condition, the user requests a waveform of any internal signal covering a predetermined time period relative to the trigger condition. Depending on the triggering mode, the trigger can occur at the beginning ("begin" trigger mode), at the end ("end" trigger mode), or in the middle ("middle" trigger mode) of the predetermined time period. In this implementation, since the amount of memory in logic analyzer 403 limits the number of sets of "past" sample signals (i.e., the sample signals present at clock transitions occurring prior to the trigger condition) that can be stored, the frequency in which snapshots of state elements in the design are reported to control program 402 is determined by both the size of logic analyzer 403's memory and the total number of past sample signals. In one implementation, with a 1 M bytes of logic analyzer memory, snapshots are provided every 6250, 3125 and 300 clock transitions for the "end", "middle" and "begin" trigger modes, respectively.

Figure 7:
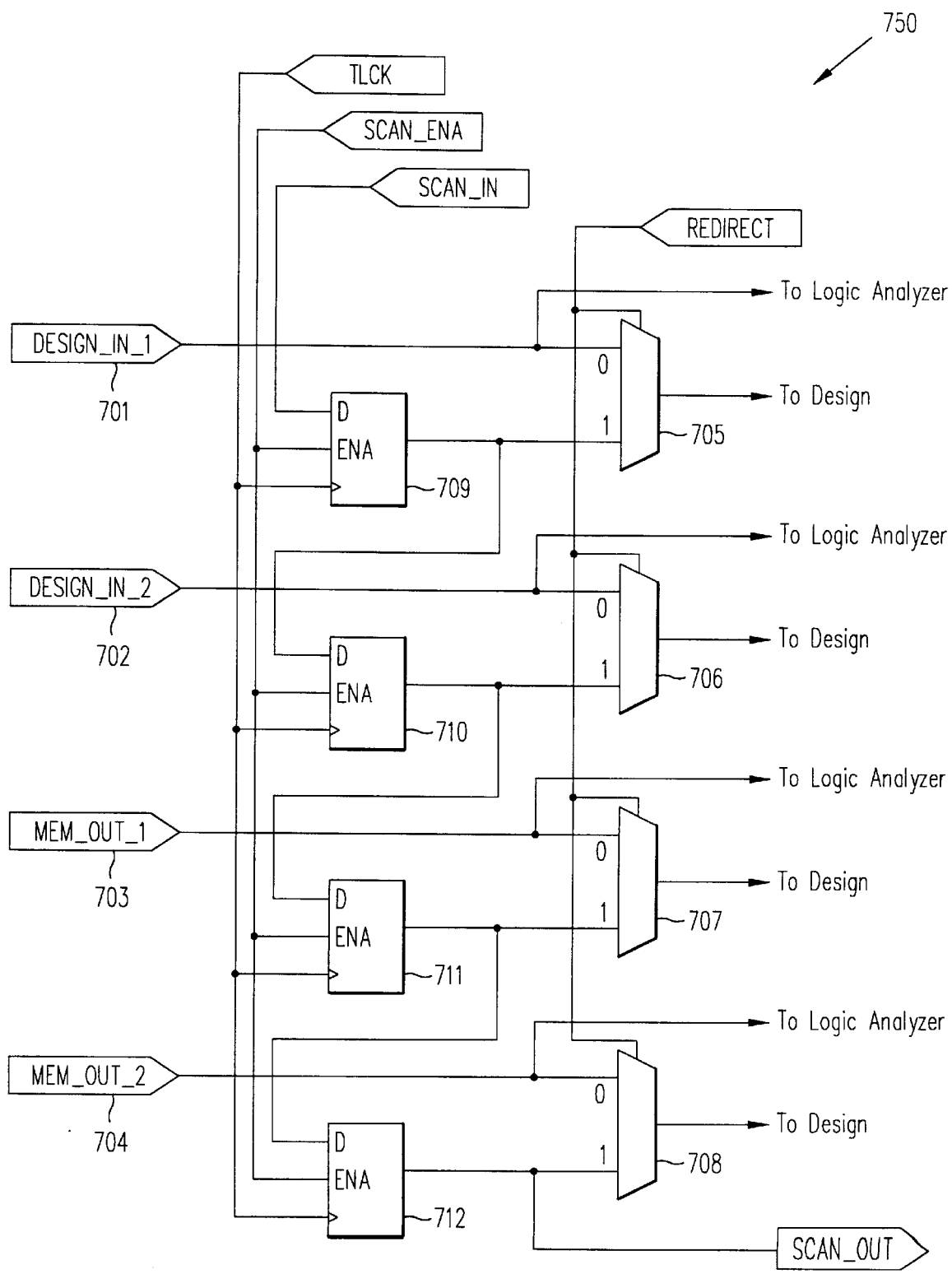
FIG. 7 illustrates an interface between emulator 401 and logic analyzer 403, showing routing of input signals 701 and 702, and memory output signals 703 and 704 to logic analyzer 403, and a scan chain for applying these signals to the design externally.

As mentioned above, to avoid saving all memory elements, values retrieved from memory are treated as primary input signals to the design under emulation. The interface between logic analyzer 403 and emulator 401 is illustrated by circuit 700 shown in FIG. 7. As shown in FIG. 7, during emulation, primary input signals (e.g., input signals 701 and 702), memory output signals (e.g., memory output signals 703 and 704), and signals from combinational cycles (e.g., the signal at terminal 1204) are tapped to logic analyzer 403 and applied to the design under emulation through multiplexers 705–708 and 1202. However, during replay multiplexers 705–708 and 1202 select as input signals to the design under emulation the output signals of flip-flops 709–712 and 1203. Flip-flops 709–712 and 1203 are clocked by test clock "tclk" and form part of a scan chain which routes external sample signals, during replay, to be applied to the design under test.

Figure 5:
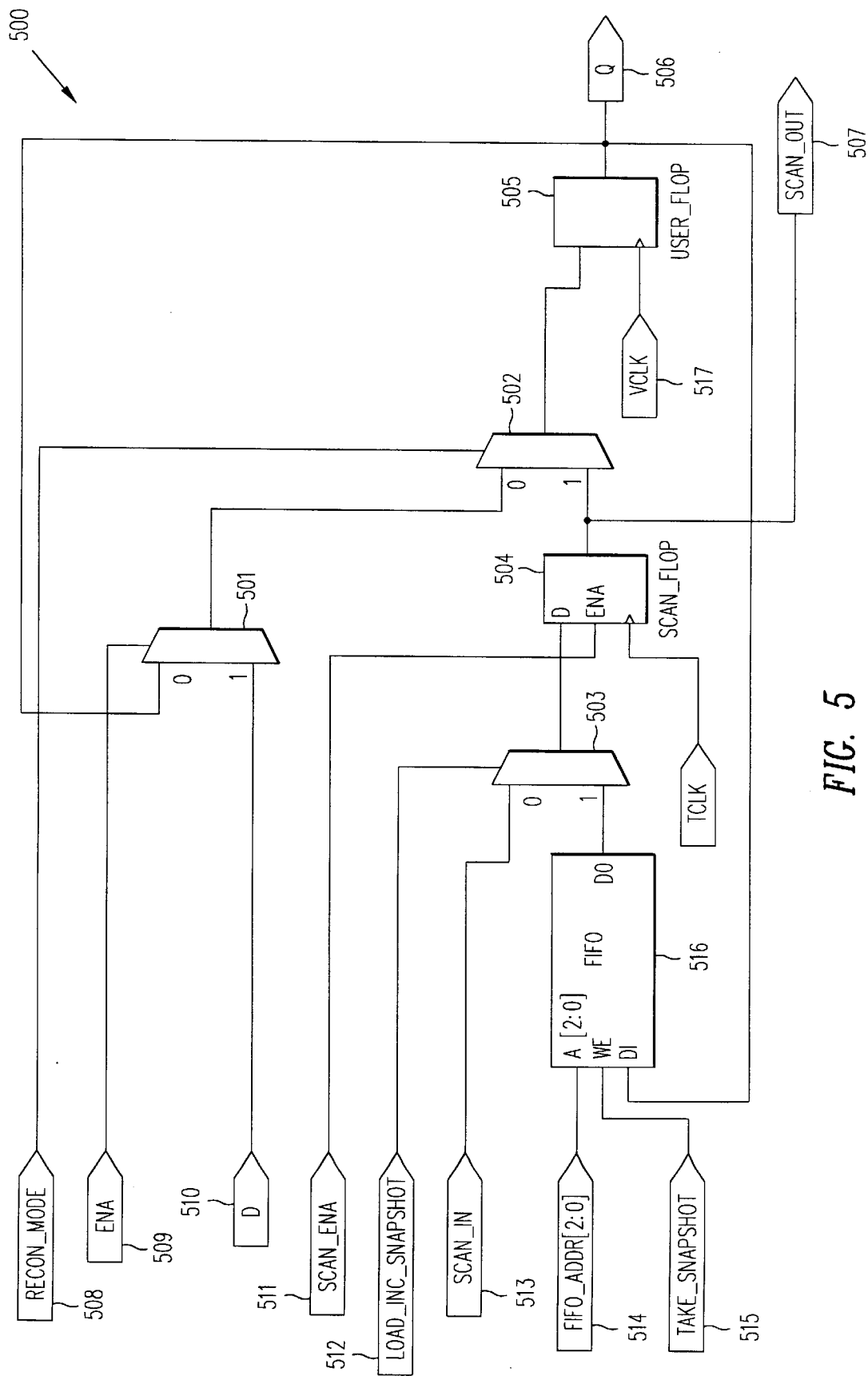
FIG. 5 is a schematic diagram 500 of a flip-flop used in the present invention to implement a flip-flop of a state element.

In addition, the scan chain also allows snapshots of the state elements to be scanned out of the design under emulation and a stored snapshot to be loaded into the state elements. This scan chain can serve the dual purposes of functional testing and signal reconstruction. To serve this dual purpose, in this implementation, a flip-flop in the scan chain is implemented by flip-flop 504 of FIG. 5. As shown in FIG. 5, since time in emulation system 400 is discretized by the virtual clock, user flip-flop 505 is clocked by virtual clock (vclk) signal at terminal 517. During functional operations, when the enable signal at terminal 509 is inactive, the value in user flip-flop 505 is recirculated from output terminal 506 of user flip-flop 505 through multiplexers 501 and 502. When the enable signal 509, which is typically a clock signal of a clock domain in the design under emulation, the signal at input terminal 510 is captured in user flip-flop 505. During reconstruction, however, user flip-flop 505 loads from scan flip-flop 504, which is clocked by a test clock signal (Tclk). The input signal of scan flip-flop 504 is selected by multiplexer 503, which selects according to the control signal at terminal 511 either a snapshot bit stored in first-in-first-out (FIFO) memory 516, or a bit scanned in at terminal 513 of the scan chain. The output value of scan flip-flop 504 can be scanned out via output terminal 507. In this implementation, eight snapshots are preserved in FIFO memory 516. Snapshots are taken under control of the control signal at terminal 515.

Emulation system 400 converts each latch of the user design into one of a number of functionally equivalent alternative structures, according to the context in which the latch is used. Each of these functionally equivalent alternative structure includes a D-type flip-flop. In that conversion, when the external behavior of the emulated design is unaffected, a delay relative to the original latch may be introduced in the output data of the equivalent structure (e.g., delaying an output signal transition from a rising clock edge to a falling clock edge). To support reconstruction, the D-type flip-flops in these functionally equivalent alternative structures are replaced, just as other D-type flip-flops in the design, by flip-flop 500 of FIG. 5. To ensure correct reconstruction of the original latch behavior, the timing characteristics of the output signal of each converted latch is recorded by the emulator compiler in a file. During reconstruction, the reconstruction engine is guided by the file to restore the timing characteristics of the original latches.

Figure 12:
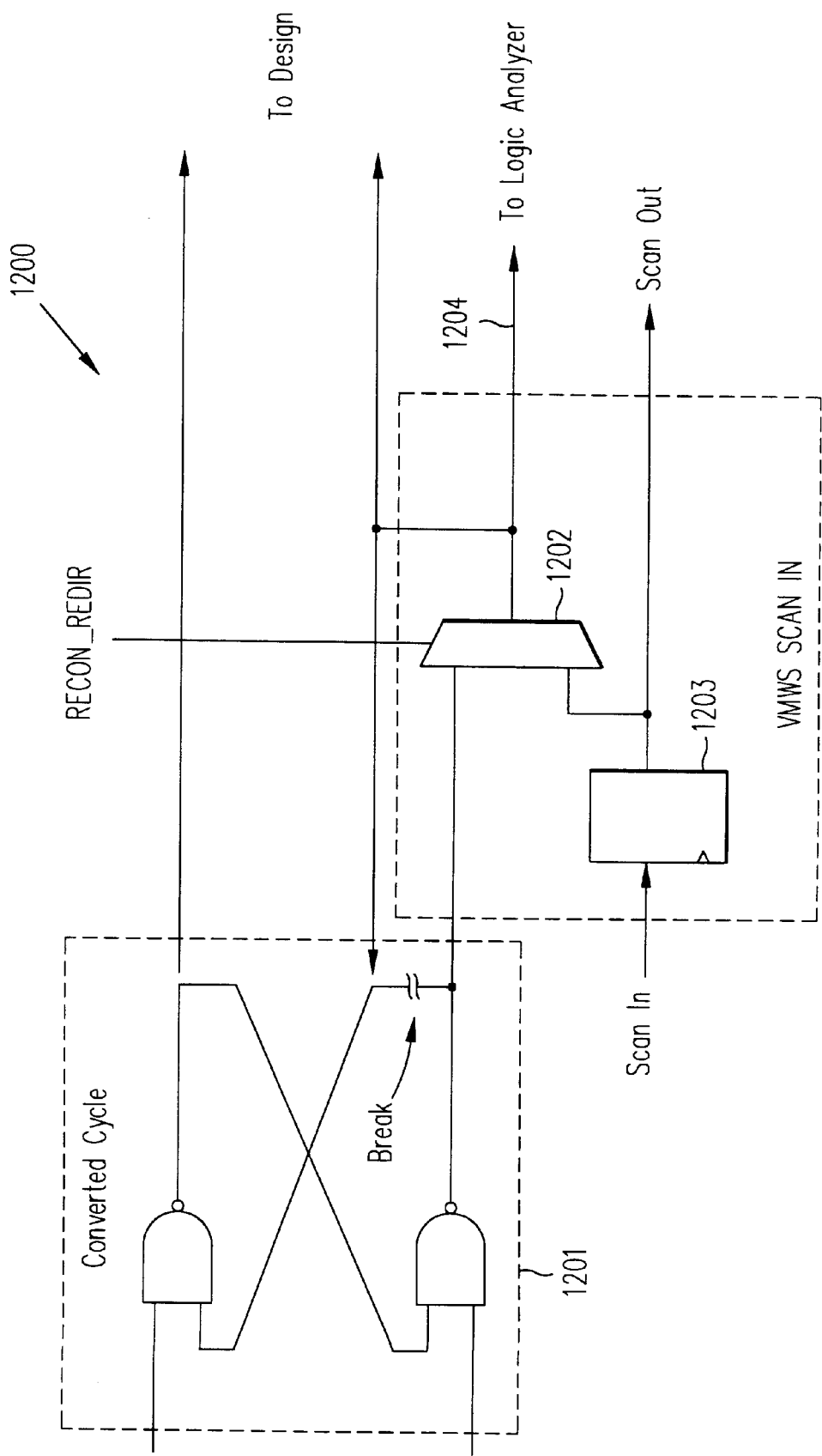
FIG. 12 illustrates the treatment of combinational cycle in one embodiment of the present invention.

To allow replay of logic values in a combinational cycle (i.e., a combinational circuit with feedback), emulation system 400 breaks the cycle and probes the logic value as a sample value where the cycle is broken. FIG. 12 illustrates the treatment of combinational cycle in one embodiment of the present invention. As shown in FIG. 12, in place of a combinational circuit 1201 in the user design, emulation system 400 provides circuit 1200, which includes combinational circuit 1201, modified by breaking the combinational cycle inside circuit 1201, and multiplexer 1202. (Combinational circuit 1201, although shown in FIG. 12 as a cross-coupled NAND gate for illustrative purpose, can be any combinational circuit with one or more cycles). During emulation, multiplexer 1202 receives the logic value at the point where the cycle is broken, provides the probed value to the logic analyzer for recording as a sample value and, at the same time feeds the probed value back to the combinational circuit to complete the broken combinational cycle. During reconstruction, multiplexer 1202 feeds the output value of flip-flop 1203 back to the broken combinational cycle. Flip-flop 1203 is in the scan chain discussed above, and received the sample value probed during emulation. By feeding the sample value back into the broken combinational cycle, the difficulty in properly initializing a combinational cycle during reconstruction is avoided.

A counter is provided which counts the number of clock transitions or edges in all clock domains. Whenever the counter reaches a specified value, a snapshot is taken. The counter is reset after the specified value is reached. When a snapshot is taken, some logic signals in some clock domains may not yet have stabilized. A faithful reconstruction must take into account such effects. Thus, to allow accurate reconstruction using the sample signals, the number of virtual clock cycles ("clock_delta") which elapse between two successive sets of sample signals is recorded. During reconstruction, emulator 401 is allowed to run for the exact number of virtual clock cycles between applying these sets of sample signals. Emulator 401 is then frozen while the resulting state vector is scanned out and a new set of sample signals are scanned in.

Figure 6:
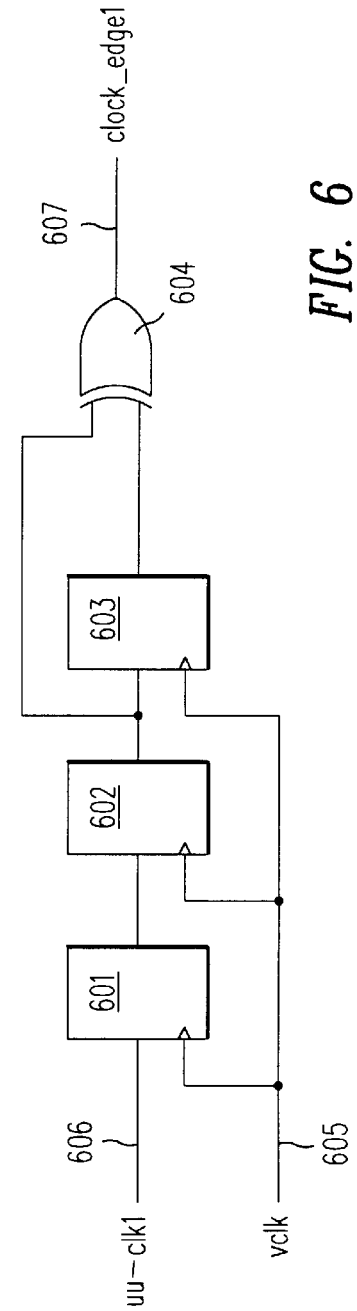
FIG. 6 shows a clock edge detector circuit 600, which receives a first clock signal "uu_clk1" and provides a pulse synchronized to a second clock signal "vclk", whenever uu_clk1 transitions.
Figure 8A:
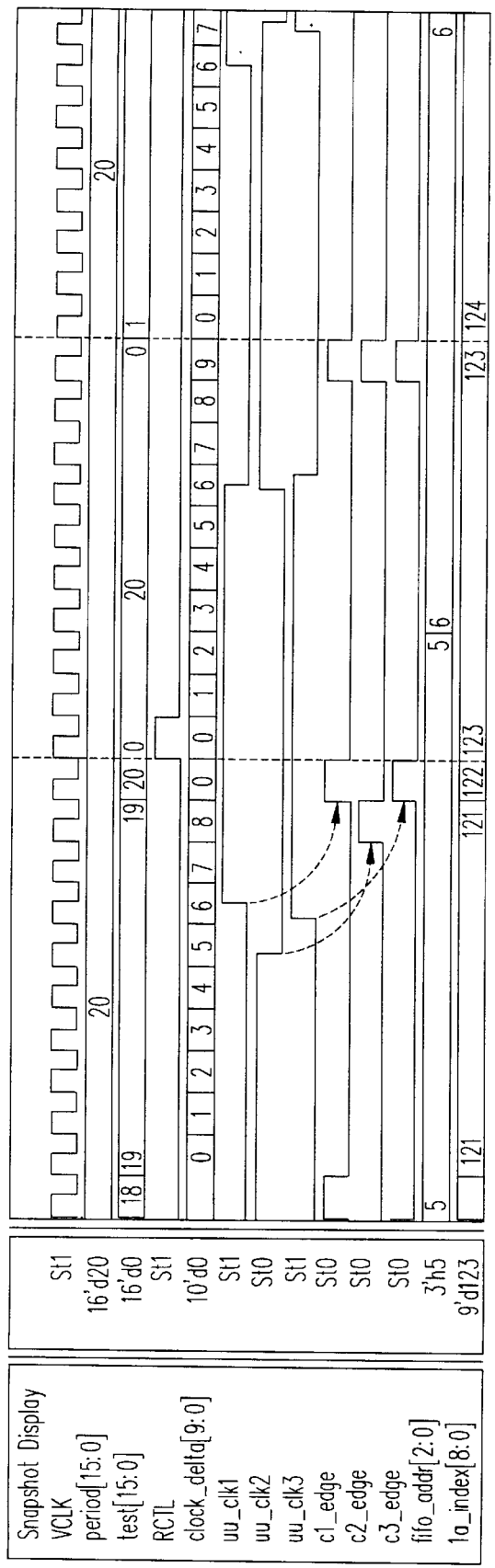
FIG. 8a is a timing diagram illustrating the taking of a snapshot during emulation.
Figure 8B:
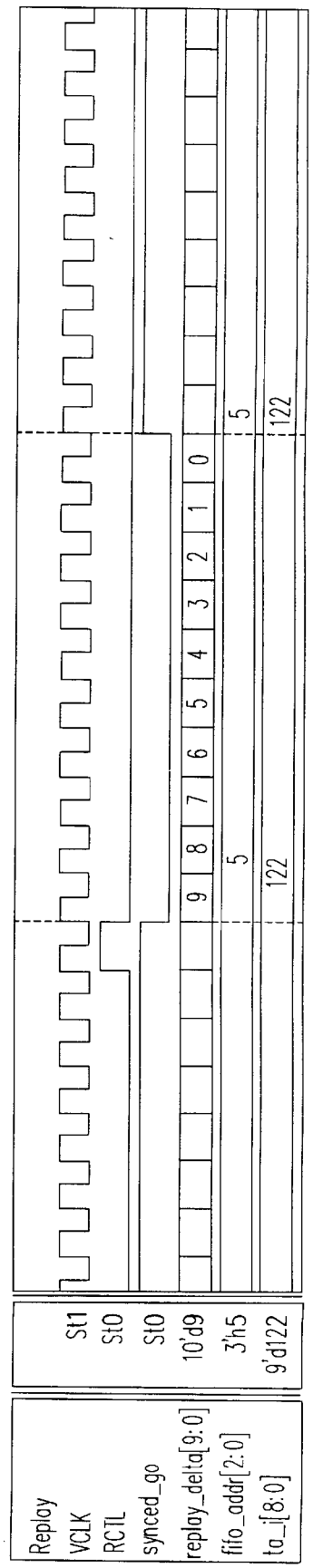
FIG. 8b is a timing diagram illustrating replaying from a snapshot to obtain a state vector during reconstruction.

The timing diagrams of FIGS. 8a and 8b illustrate taking a snapshot during emulation and replaying to obtain a state vector during reconstruction. FIG. 8a illustrates a design under emulation having clock domains "uu_clk1", "uu_clk2", and "uu_clk3". The clock transitions of clock domains domains "uu_clk1", "uu_clk2", and "uu_clk3" are detected and synchronized to the virtual clock (vclk) by detector circuits, which provide output signals "c1_edge", "c2_edge" and "c3_edge", respectively. An example of a detector circuit suitable for this purpose is detector circuit 600 shown in FIG. 6. As shown in FIG. 6, detector circuit 600 includes serially connected flip-flops 601–603, which are each clocked by the vclk signal at terminal 605. The input clock signal is provided at the data input terminal 606 of flip-flop 601. The output signal at terminal 607 is the exclusive-OR of the output signals of flip-flop 603 in the two most-recent vclk cycles.

The 10-bit value "clock_delta" counts the number of vclk periods between successive falling edges of clock signals "uu_clk1", "uu_clk2", and "uu_clk3". An integer "la_index" indexes each clock_delta value. (For example, clock_delta is 10—0 to 9—during the time period indexed by la_index 123; notice the delay, for example, between the falling clock edge of clock signal "uu_clk2" and its corresponding pulse in signal "c2_edge"). A 16-bit value "test" counts the number of clock transitions since the last snapshot. A 16-bit value "period" indicates the number of clock transitions between taking snapshots (hence the snapshot frequency). Thus, as shown in FIG. 8a, when the value test reaches the value "period" (in this case, the value 20 is reached at the end of time period 122), signal RCTL is activated to take a snapshot. Signal RCTL is routed to every state element to cause a snapshot to be taken and stored in a FIFO memory (e.g., FIFO memory 516 of FIG. 5) at the address indicated by the 3-bit value fifo_addr. After the snapshot is taken, fifo_addr is incremented. Further, as shown in FIG. 8a, immediately after the snapshot is taken, a clock_delta value of 10 is recorded for the time period between the snapshot and the arrival of the next set of sample signals (i.e., the time period corresponding to la_index 123).

During replay, as illustrated in FIG. 8b, the snapshot at the end of the time period indexed by la_index 122 is scanned into the state elements. The clock_delta value of 10 (for the clock_delta value for la_index 123) is scanned into emulator 401 as the next length of the next count cycle for counter "replay_delta." When replay begins, signal "synced_go" becomes active, the signal RCTL becomes inactive, and a count of 10 is loaded into counter "replay_delta". In this implementation, during replay, an active RCTL signal freezes the values of the state elements of emulator 401. Thus, an inactive RCTL allows the emulation in emulator 401 to advance by 10 vclk periods. When counter replay_delta reaches zero, signal RCTL becomes active, a state vector is scanned out of emulator 401 and a next set of sample signals are scanned into the design under emulation. Because clock_delta values are preserved between emulation and replay, accurate circuit behavior are reproduced, including any race conditions arising out of signal transitions of asynchronous clock domains.

In the implementation of FIG. 4, the control logic for the scan chain and the necessary interfaces to logic analyzer 403 and the host workstation are implemented in a dedicated FPGA. The scan chain is controlled by a state machine which accepts the following commands:

TMS_SAMPLE_SHIFT: samples all design input signals and memory output signals to tclk-based flip-flops (e.g., flip-flops 708–712 of FIG. 7, flip-flop 504 of FIG. 5, and flip-flop 1203 of FIG. 12).

TMS_EMBED: enables the primary input and output terminals of the design under emulation.

TMS_REDIRECT: disables the primary input and output terminals of the design under emulation; under this mode, the design under emulation receives primary input and memory output values from tclk-based flip-flops.

TMS_MEM_WRITE: enters a number of states in which emulator 401's static random access memories (SRAMs) are written using address and data scanned in.

TMS_RECON_RESET: resets the snapshot-taking hardware in emulator 401 and the trigger condition register of logic analyzer 403, and enters a mode in which an active RCTL signal causes a snapshot to be taken.

TMS_RECON_REPLAY: enters a state in which signal RCTL is a global clock disable signal (i.e., emulation proceeds only when RCTL is brought low).

TMS_RECON_GO: brings signal RCTL low (thus allowing emulation to proceed) for a predetermined number (i.e., clock_delta) cycles of the virtual clock.

TMS_RECON_FCLR: clears the address register of the FIFO memory.

TMS_RECON_FINC: increments the address register of the FIFO memory by 1.

TMS_RECON_SHIFT: sets the address multiplexers to select the state scan chain (i.e., scans out state element values); otherwise, the scan chain scans in sample signals.

TMS_RECON_SCANLD: loads state scan flip-flops (e.g., flip-flop 504 of FIG. 5) from FIFO memories (e.g., FIFO memory 516 of FIG. 5).

TMS_RECON_ULDON: sets a mode in which all user flip-flops (e.g., user flip-flop 505 of FIG. 5) load from state scan flip-flops.

TMS_RECON_ULOFF: sets a mode in which all users flip-flops load from data input terminals (e.g., data input terminals 510).

Figure 9:
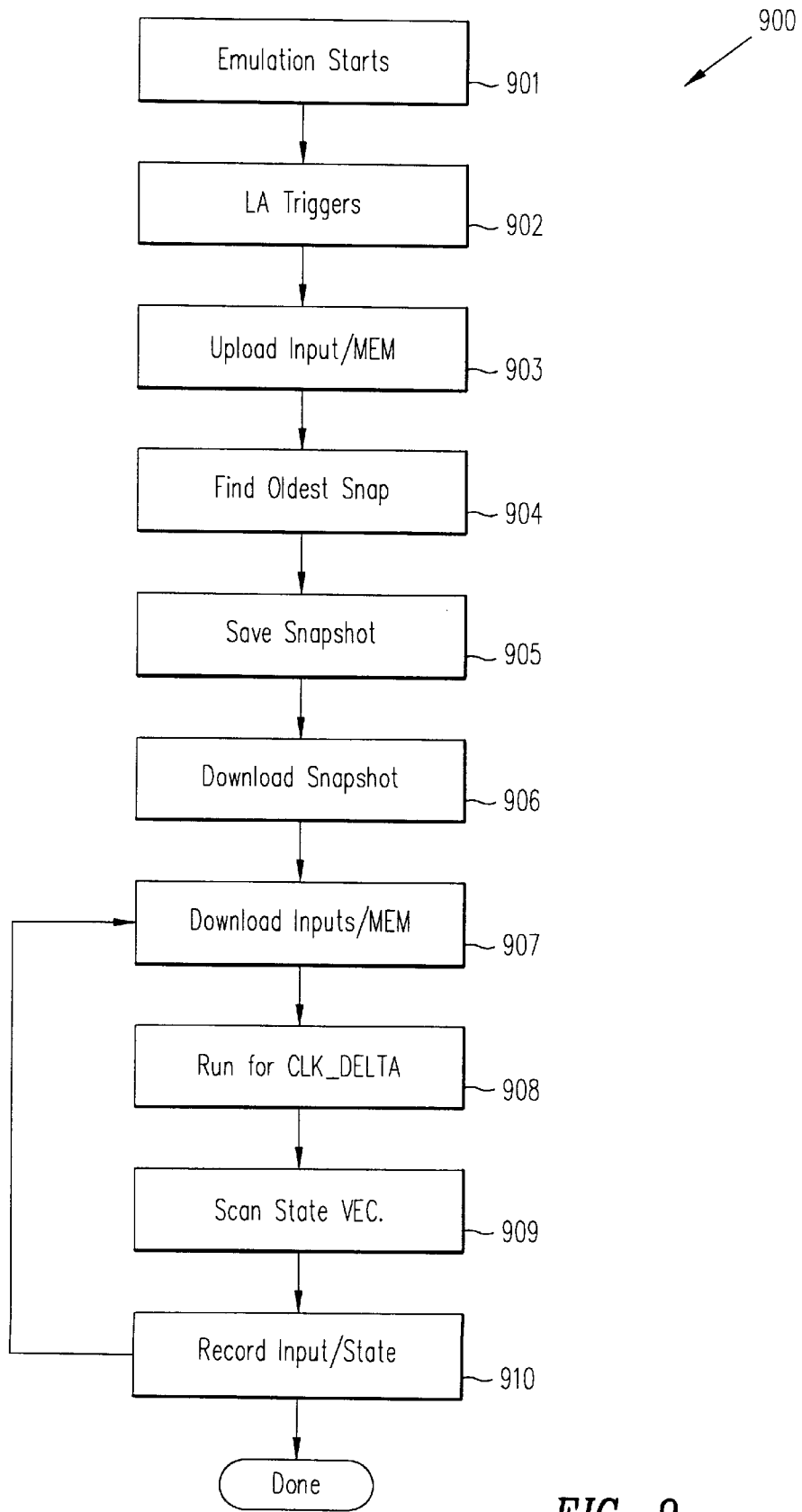
FIG. 9 is a flow diagram summarizing reconstruction operations performed in an emulator, in one embodiment of the present invention.

The reconstruction operations of emulator 401 are summarized by flow diagram 900 of FIG. 9. As shown in FIG. 9, at step 901, an emulation of the design begins with snapshots of the state elements taken at a predetermined frequency. The primary input signals, the memory output signals, and the signals from combinational cycles are captured by a logic analyzer in its memory. At step 902, a trigger event occurs in the logic analyzer. The emulator is alerted to the trigger event, whereupon no further snapshots of state elements are taken. At step 903, the primary input signals and the memory output signals saved in the logic analyzer are uploaded into the host workstation. At step 904, the oldest set of sample signals for which a snapshot exists is identified. During this time, the design under emulation can remain "in-circuit". If, instead of the present emulator, a different emulator (perhaps an out-of-circuit emulator) is used for reconstruction, the desired snapshot stored in the FIFO memories of state elements is scanned out to the host workstation and stored (step 905). At step 906, the snapshot is loaded into the state elements. If the emulator which generated the snapshot is used in reconstruction, the snapshot is loaded from the FIFO memories. Otherwise, the snapshot is scanned by the host workstation into the state elements through the scan chain.

Prior to replaying the emulation from the snapshot, several sets of sample signals occurring immediately prior to the snapshot are applied to the design under emulation while holding the design state elements to the snapshot values, to ensure that flip-flops in multicycle paths are initialized to proper values.

Steps 907–910 are repeated until all sets of sample signals are applied to the design under emulation. At step 907, the sample signals are scanned into the design under emulation through the scan chain and applied. At step 908, using the sample signals, emulation is allowed to proceed for the appropriate clock_delta virtual clock periods associated with the sample signals. At step 909, a state vector is scanned out of the design under emulation. Adjustments to each signal's timing, required because of the latch conversions in the emulator, are applied as the state vector is scanned out of the design under emulation. The scanned vectors are then stored for later access by a reconstruction engine.

In the present embodiment, to efficiently store the state vectors, each signal in a state vector are stored in a run-length encoded format. In the run-length encoded format, each signal is represented by a sequence of (32-bit pattern, 32-bit run-length)-tuples, in which the 32-bit pattern represents the logic values of the signal over 32 successive clock edges, and the 32-bit run-length is the number of times the 32-bit pattern is repeated before the pattern is broken. Substantial storage space can be saved under this representation for periodic signals such as clock signals and signals which are held at one value for long periods of time.

Figure 10A:
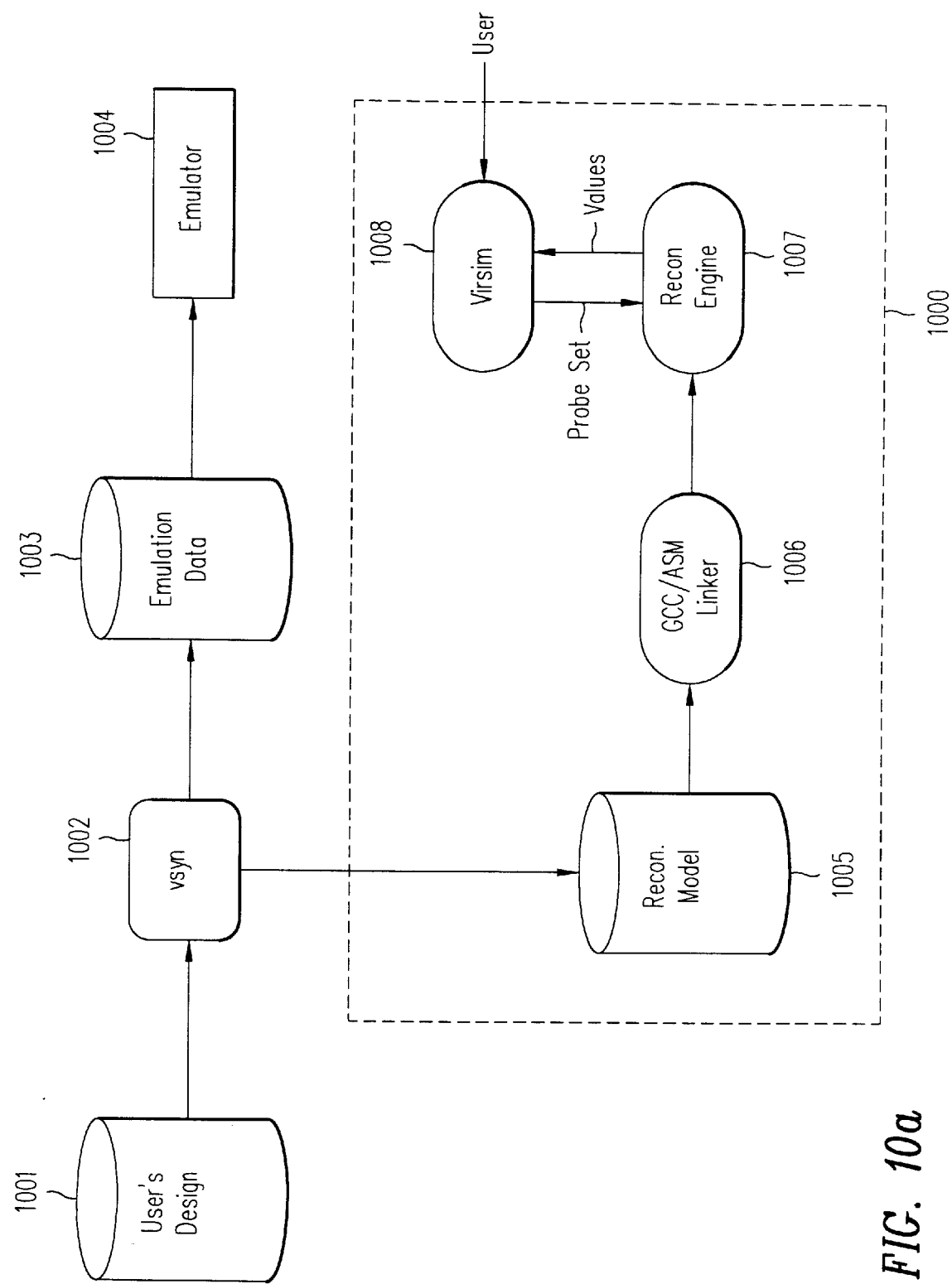
FIG. 10a is a schematic block diagram showing a reconstruction subsystem 1000 tightly coupled to a logic simulator, in accordance with one embodiment of the present invention.

A reconstruction subsystem, such as reconstruction subsystem 408 of FIG. 4, can be tightly coupled to an existing waveform tool, such as Virsim, available from Summit Design Systems. One implementation of reconstruction subsystem 408 is shown schematically as reconstruction subsystem 1000 in FIG. 10a. In FIG. 10a, the user design 1001 is compiled by a model compiler ("vsyn") 1002 to provide a reconstruction model 1005 and an emulator model 1003, respectively, for reconstruction subsystem 1000 and emulator 1004. Model compiler 1002 identifies the signals that are required to be part of the state vector to allow reconstruction. Emulator model 1003 is a conventional emulation model together with the modifications (e.g., such as the latch conversion and the reconstruction control FPGA described above), suitable for use in the operations summarized above in conjunction with FIG. 9.

Reconstruction model 1005 includes (a) a logic simulator model of the user design, provided in a source language that can be compiled into executable code (e.g., C or assembly language) and organized in clusters of individually callable logic evaluation blocks, (b) a mapping of signal names in the user design to the callable logic evaluation blocks, and (c) a mapping of the state vector to primary input signals, output signals of state elements, output signals of flip-flops receiving input signals from combinational cycles, and output signals memories (i.e., all sample signals).

Reconstruction model 1005 is then compiled in linker 1006 into object code and merged with the object codes of additional utility routines (the "kernel") to provide a package (i.e., reconstruction engine 1007) that can be called to perform the reconstruction. Utility routines that are typically included in the kernel include (a) routines for initializing ROMs, and evaluating them as combinational logic, (b) routine for reading in state vectors and sample signals, (c) routines for selecting logic blocks to evaluate, based on the signals whose waveforms are requested, and (d) routines for data formatting, for formatting input signals into the logic simulator and output signals to the waveform tool.

Reconstruction engine 1007 can then be called from waveform tool 1008 for evaluation of any internal signal. Typically, logic simulator 1008 is associated with a waveform tool that has a user interface through which a user can request display of a waveform for any net of user design 1001.

Figure 10B:
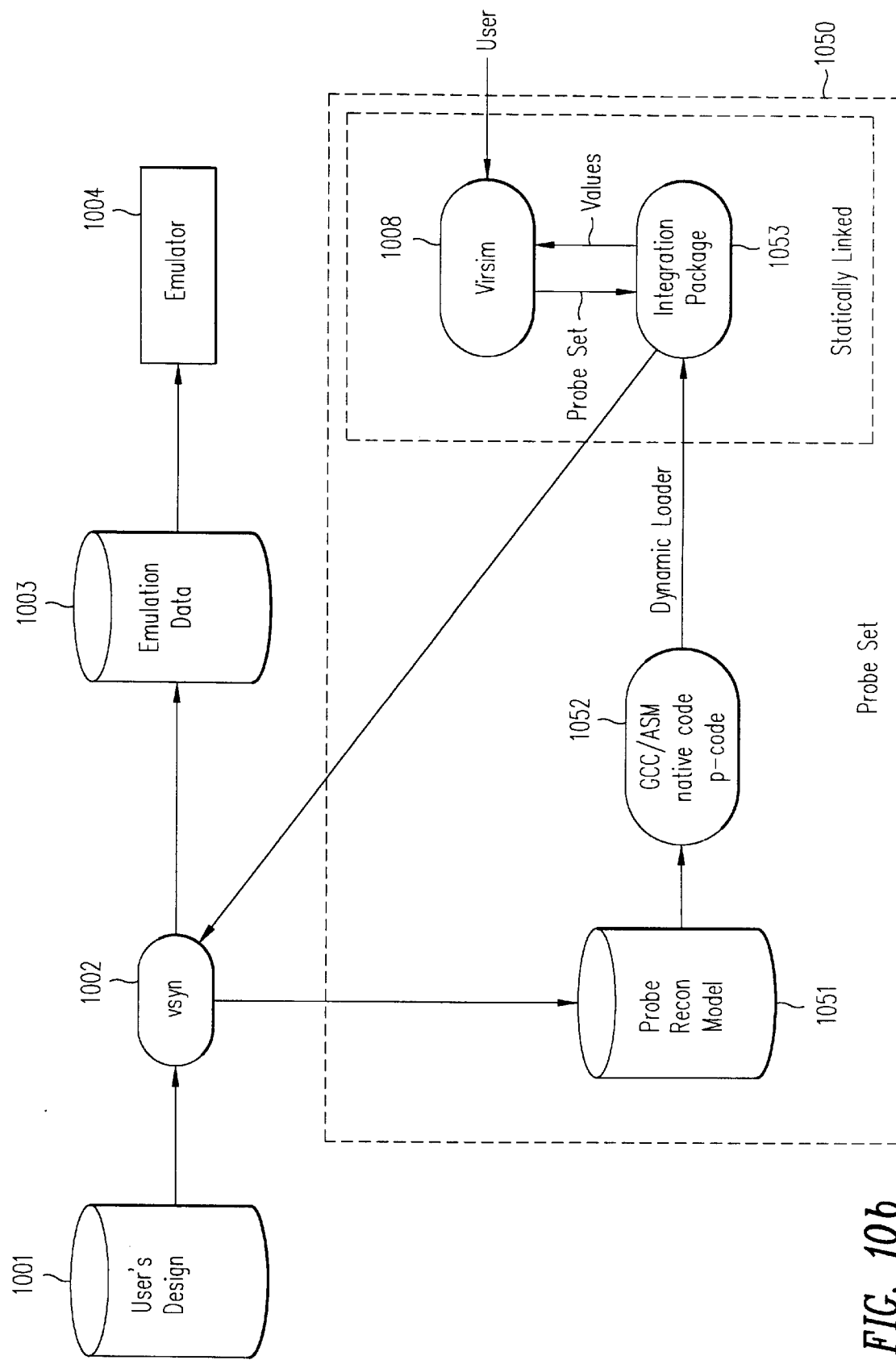
FIG. 10b is a schematic block diagram showing a reconstruction subsystem 1050 tightly coupled to a logic simulator, in accordance with a second embodiment of the present invention.

Alternatively, a reconstruction subsystem such as reconstruction subsystem 1050 of FIG. 10b can be provided. In FIG. 10b, emulation model 1003 is provided by model compiler 1002 and emulated in emulator 1004 in the same manner as discussed above in conjunction with FIG. 10a, thereby providing the state vectors and the sample signals as discussed.

In reconstruction subsystem 1050, reconstruction model 1051 is not provided at the time model compiler 1002 compiles emulation model 1003. Instead, when the user requests waveforms of specific nets, waveform tool 1008 calls back the utility routines in integration package 1053, which includes an interface to model compiler 1002. Through this interface to model compiler 1002, integration package 1053 passes a list of nets to model compiler, which then compiles a reconstruction model 1051 based on this list of nets. Unlike reconstruction model 1005, reconstruction model 1051 elaborates only the portion of the design hierarchy that is necessary to evaluate the requested nets. One technique for selecting the portion of the design hierarchy to partially elaborate uses a depth-first search of the fan-in of each net until a state element or a primary input terminal is reached. The partial elaboration of the design hierarchy includes all nets visited during the depth-first search. Reconstruction model 1051 thus compiled can then be compiled into object code and linked in the manner discussed above, or distilled into "p-code" for an interpreter. Integration package 1053 then transfers control to the linked object code for evaluation of the nets. The results of the simulation is then returned to the waveform tool associated with logic simulator 1008, as discussed above.

Figure 11A:
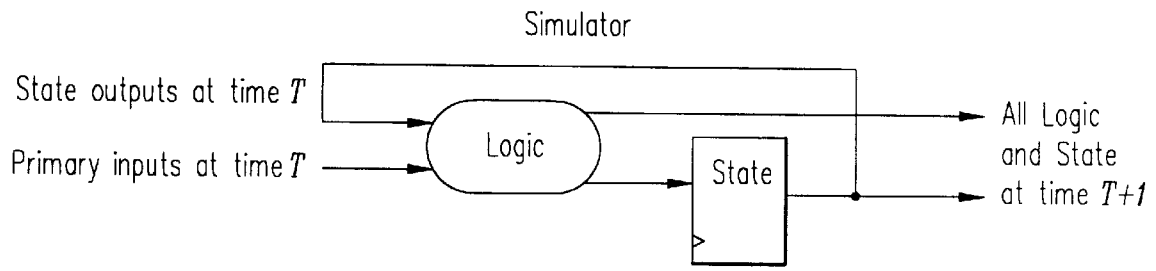
FIG. 11 contrasts sequential execution of a logic simulator (11a) with parallel execution in a reconstruction engine (11b).
Figure 11B:
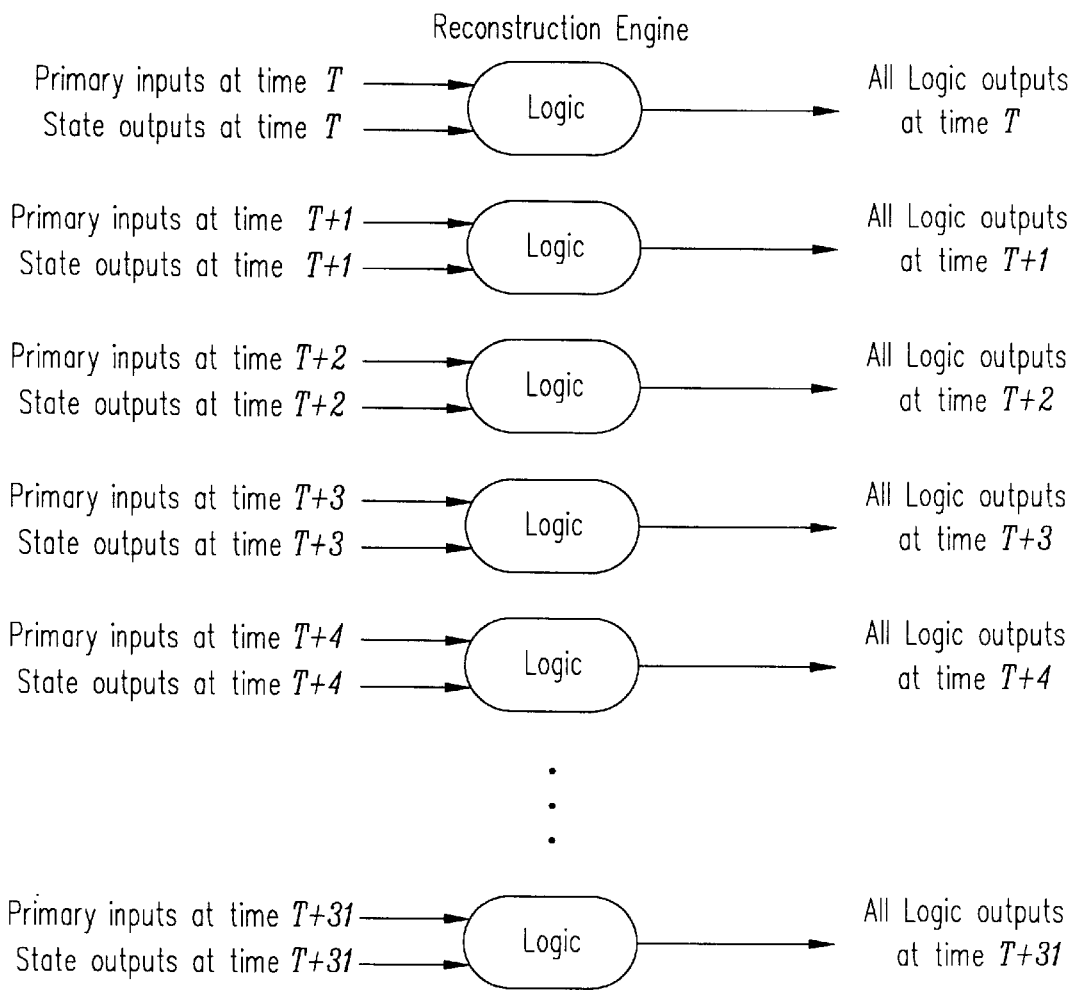

In the embodiments discussed above, since the state vectors and the sample signals are provided at the time of reconstruction over the entire time period of interest, multiple segments of a waveform of any given net can be evaluated in parallel. In some implementations, up to 32 segments of a waveform can be evaluated in parallel, thus providing tremendous efficiency. Parallel execution in a reconstruction engine is possible because, unlike a logic simulator, which computes state values and output values of a design at a given time period from input values of the time period and state values of the previous time period, a reconstruction engine receives as input, at the outset, the state values and the input values of a design over all relevant time periods. Consequently, the evaluation of output values for any given time period can be carried out independently of any other time period. FIG. 11 contrasts sequential execution of a logic simulator (11a) with parallel execution in a reconstruction engine (11b).

The above detailed description is provided to illustrate specific embodiments of the present invention and is not intended to be limiting. Numerous variations and modifications within the scope of the present invention are possible. The present invention is set forth in the following claims.

We claim:

1. A method for providing visibility into state nets of a design under emulation, comprising:

running said emulation for said design in an emulator and, during emulation, (a) providing at predetermined intervals snapshots of said emulation, each snapshot including output values of state elements of said design; and (b) providing at each transition of a clock signal within said design, a set of sample signals, each set of sample signals including primary input signals of said design and output values of memory circuits of said design;

at a subsequent time, re-running said emulation by loading into an emulator the values of said state elements using a selected one of said snapshots and, at each clock transition subsequent to said snapshot, (a) applying said sample signals corresponding to said clock transition to said design, and (b) providing as output a state vector corresponding to said clock signal transition, said state vector including values of said state elements at said clock signal transition; and receiving said state vectors and said sample signals into a reconstruction engine, and evaluating waveforms of said nets of said design using said state vectors and said sample signals.

2. A method as in claim 1, wherein said predetermined intervals are computed from the number of transitions in multiple clock domains.

3. A method as in claim 1, wherein said sample signals are recorded by a logic analyzer.

4. A method as in claim 1, wherein said sample signals further comprises logic signals from combinational circuits that include cycles.

5. A method as in claim 4, wherein said logic signals are provided as sample signals back into said combinational circuits during said re-running of said emulation.

6. A method as in claim 1, wherein said emulation is run using a virtual clock signal, wherein the number of cycles of said virtual clock signal between successive sets of said sample signals are recorded, and wherein when said re-running step applies to said design said sets of sample signals, said re-running step maintains said number of cycles of said virtual clock between application.

7. A method as in claim 1, further comprising storing said snapshots in first-in-first-out (FIFO) memories associated with said state elements.

8. A method as in claim 1, wherein said state vectors are stored using a data compression technique.

9. A method as in claim 8, wherein said data compression technique comprises run-length encoding.

10. A method as in claim 1, wherein said emulation replaces latches in said design by flip-flops having timing characteristic different from timing characteristics of said latches, wherein said evaluation step restores to said design said timing characteristics of said latches.

11. A method as in claim 1, further comprising viewing said waveforms with a waveform tool.

12. A method as in claim 1, wherein said step of evaluating waveforms of said nets performs evaluation of multiple segments of a waveform in parallel.

13. A method as in claim 1, said sample signals are applied to said design under said modeling process through a scan chain circuit generated for said design.

14. A method as in claim 1, said state vector is provided from said design under said emulation through a scan chain circuit generated for said design.

15. A method as in claim 1, wherein said evaluation step being performed using a reconstruction model generated from said design under emulation.

16. A method as in claim 15, further comprising generating said reconstruction model from said design, said reconstruction model comprising source models which can be compiled into executable object code.

17. A method as in claim 16, further comprising a partially elaborating of a hierarchy of said design prior to generating said reconstruction model.

18. A method as in claim 15, wherein said reconstruction model includes both a net list of design and utility routines callable from said reconstruction engine to perform said evaluation step.

19. A system for reconstructing waveforms of state nets of a design under emulation in an emulator, comprising:

a model compiler compiling said design into a logic circuit configurable in said emulator, said model compiler providing, for selected state elements, a memory circuit for saving a value of each of said state elements, and a loading circuit for loading a value into each of said state elements;

an emulation controller receiving from said model compiler said logic circuit, said emulation controller causing (a) a first emulation of said logic circuit, (b) snapshots of said selected state elements in said logic circuit to be saved into said memory circuit at predetermined intervals, each snapshot including values of state elements in said logic circuit, and (c) at a later time, a second emulation of said logic circuit starting from one of said snapshots of said selected state elements and providing from said second emulation state vectors at selected times, each said state vectors including values of said selected state elements at the corresponding one of said selected times; and an interface to a reconstruction engine, said interface providing to said reconstruction engine a representation of said design and said state vectors for use in an evaluation of said logic circuit to obtain said waveforms.

20. A system as in claim 19, wherein said memory circuit comprises a first-in-first-out (FIFO) memory.

21. A system as in claim 19, further comprising a logic analyzer coupled to said emulator, said model compiler further providing a probe circuit in said logic circuit for routing primary input signals to said logic analyzer.

22. A system as in claim 21 wherein said probe circuit further provides said logic analyzer output signals of memory elements in said logic circuit.

23. A system as in claim 22, wherein said interface to said reconstruction engine provides said sample signals to said logic evaluation, said sample signals including said output signals of said memory elements and said primary input signals.

24. A system as in claim 23, wherein said sample signals further comprising signals from a combinational logic circuit that includes a cycle.

25. A system as in claim 19, wherein said representation of said design includes an executable model of said design and utility routines for data management and for application of said state vectors to said executable model.

26. A system as in claim 25, further comprising a second model compiler for generating said executable model, said second model compiler comprising a partial circuit elaborater for providing a partially elaborated executable model of said design.

27. A system as in claim 25, wherein said reconstruction model includes utility routines for performing reconstruction of multiple portions of one of said waveforms in parallel.

28. A system as in claim 19, wherein said model compiler further provides in said logic circuit a scan chain for providing said values into said loading circuit and for retrieving said state vectors from said selected state elements.

29. A system as in claim 19, wherein said model compiler replaces latches in said design by flip-flops, said flip-flops having timing characteristics different from the timing characteristics of said latches, wherein said logic evaluation restores to said design the timing characteristics of said latches.

30. A system as in claim 19, further comprising a storage element receiving for storage said state vectors, said storage element storing said state vectors using a data compression technique.

31. A system as in claim 30, wherein said data compression technique comprises run-length encoding of a repetitious pattern.

32. A method for reconstructing a waveform of an internal terminal of a circuit over a given time period, said circuit having one or more clock domains, said method comprising:

synchronizing each of said clock domains to a virtual clock domain of higher frequency than the frequency of each of said clock domains;

using a counter, maintaining an index of the clock periods of said virtual clock domain;

receiving logic values of state elements of said circuit at successive clock transitions of said clock domains over said time period, and keeping track of successive clock transitions by storing the values of said index when said successive clock transitions occur;

receiving input values to said circuit at said successive clock transitions of said clock domains; and evaluating said waveform using a model of said circuit, and applying said logic values of said state elements, and said input values to said circuit, using said stored values of said index to maintain relative times of occurrence of said successive clock transitions.

33. A method as in claim 32, wherein said evaluating step evaluates selected time points on said waveform in parallel.

34. A method as in claim 32, wherein said logic values of state elements being received from a modeling process.

35. A method as in claim 34, wherein said modeling process comprises an emulation in an emulator.

36. A method as in claim 34, wherein said modeling process comprises a simulation in a logic simulator.

37. A method as in claim 32, further comprising the step of receiving a logic value from each combinational cycle of said circuit at successive clock transitions of said clock domains over said time period.

38. A method as in claim 32, further comprising the step of viewing said waveform in a waveform viewer.

39. A method as in claim 38, wherein said waveform is selected through a user interface, and said evaluation step being carried out upon selection of said waveform.

40. A method as in claim 32, wherein said logic values and said input values are stored using data compression techniques.

41. A method as in claim 32, wherein said model of said circuit is provided as executable code.

* * * * *